(12) United States Patent
Martin et al.

(10) Patent No.: US 7,096,133 B1
(45) Date of Patent: Aug. 22, 2006

(54) METHOD OF ESTABLISHING BENCHMARK FOR FIGURE OF MERIT INDICATIVE OF AMPLIFIER FLICKER NOISE

(75) Inventors: Samuel S. Martin, Santa Clara, CA (US); Brian R. Baker, Hillister, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/908,564

(22) Filed: May 17, 2005

(51) Int. Cl.
*G06F 11/00* (2006.01)

(52) U.S. Cl. .......................................... 702/77; 324/613

(58) Field of Classification Search ................. 702/77, 702/76, 189; 324/613–619
See application file for complete search history.

(56) References Cited

U.S. PATENT DOCUMENTS

| | | | | |
|---|---|---|---|---|
| 6,072,947 | A * | 6/2000 | Roychowdhury et al. | 703/14 |
| 2005/0100084 | A1 * | 5/2005 | Moloudi | 375/224 |

* cited by examiner

*Primary Examiner*—Edward Raymond
(74) *Attorney, Agent, or Firm*—Vedder, Price, Kaufman & Kammholz, P.C.

(57) ABSTRACT

A method of establishing a benchmark for a figure of merit indicative of flicker noise of an amplifier circuit.

28 Claims, 5 Drawing Sheets

METHOD OF ESTABLISHING BENCHMARK FOR FIGURE OF MERIT INDICATIVE OF AMPLIFIER FLICKER NOISE

BACKGROUND OF the INVENTION

The present invention relates to methods for noise analysis of amplifier circuits, and in particular, to methods of analysis for flicker noise of amplifier circuits.

DESCRIPTION OF THE RELATED ART

As analog integrated circuits have become more complex and dense, testing has become increasingly difficult, notwithstanding the availability and increased use of automatic test equipment (ATE). Testing difficulties have further increased as the wafers upon which the integrated circuits are fabricated have become larger. With increasingly dense circuitry and larger wafers, the number of circuits to be tested have increased exponentially.

One test, or measurement, that has always been difficult and is now increasingly difficult for the reasons noted above, is that of noise measurement for amplifier circuits. In particular, flicker noise is a difficult measurement, even with ATE, since a direct flicker noise measurement requires a long testing time interval to obtain statistically significant data. Conventional testing involves the measurement of a time dependence of a parameter, such as voltage, followed by computation of the power spectral density. As is well known, such computation is performed using a Fast Fourier Transform (FFT) analyzer or software algorithm. Such a FFT method typically requires a data acquisition time of ten times the inverse of the frequency of interest. For example, for measuring flicker noise at one Hertz, the required data acquisition interval is approximately 10 seconds. In a production environment, where high volume screening of individual circuits is necessary, e.g., as often done with operational amplifiers, a data acquisition interval of more than one second per circuit is unacceptable. Accordingly, it would be desirable to have a method for analyzing noise of an amplifier circuit with a required data acquisition interval of less than one second.

SUMMARY OF THE INVENTION

In accordance with the presently claimed invention, a method is provided for establishing a benchmark for a figure of merit indicative of flicker noise of an amplifier circuit.

In accordance with one embodiment of the presently claimed invention, a method of establishing a benchmark for a figure of merit indicative of flicker noise of an amplifier circuit includes:

receiving, for at least a measurement time interval, an output voltage of one of a plurality of amplifier circuits as a time domain voltage signal with a magnitude distribution, thermal noise voltage having a magnitude and flicker noise voltage having a profile;

digitizing at least a portion of the time domain voltage signal corresponding to the measurement time interval to provide a corresponding plurality of time domain signal data;

processing the plurality of time domain signal data in accordance with a Fast Fourier Transform (FFT) operation to compute at least a portion of the flicker noise voltage profile below a corner frequency, wherein the flicker noise voltage profile comprises a voltage versus frequency profile with each one of a plurality of successively decreasing noise voltage magnitudes at a respective one of a plurality of successively increasing frequencies, and a last one of the plurality of successively decreasing noise voltage magnitudes is at the corner frequency and approximately equal to the thermal noise voltage magnitude;

processing a portion of the plurality of time domain signal data corresponding to a portion of the measurement time interval to compute a time correlation parameter, a magnitude distribution parameter and a product of the time correlation and magnitude distribution parameters to produce one of a plurality of first coordinates; and repeating the receiving, digitizing and processings for each one of the plurality of amplifier circuits to produce the plurality of first coordinates and a plurality of second coordinates, wherein each one of the plurality of second coordinates comprises the corner frequency for a corresponding one of the plurality of amplifier circuits.

In accordance with another embodiment of the presently claimed invention, a method of establishing a benchmark for a figure of merit indicative of flicker noise of an amplifier circuit includes:

receiving, for at least a measurement time interval, an output voltage of one of a plurality of amplifier circuits as a time domain voltage signal with a magnitude distribution, thermal noise voltage having a magnitude and flicker noise voltage having a profile;

digitizing at least a portion of the time domain voltage signal corresponding to the measurement time interval to provide a corresponding plurality of time domain signal data;

processing the plurality of time domain signal data in accordance with a Fast Fourier Transform (FFT) operation to compute at least a portion of the flicker noise voltage profile below a corner frequency, wherein the flicker noise voltage profile comprises a voltage versus frequency profile with each one of a plurality of successively decreasing noise voltage magnitudes at a respective one of a plurality of successively increasing frequencies, and a last one of the plurality of successively decreasing noise voltage magnitudes is at the corner frequency and approximately equal to the thermal noise voltage magnitude;

processing a portion of the plurality of time domain signal data corresponding to a portion of the measurement time interval to compute a time correlation parameter, a magnitude distribution parameter and a product of the time correlation and magnitude distribution parameters to produce one of a plurality of first coordinates; and repeating the receiving, digitizing and processings for each one of the plurality of amplifier circuits to produce the plurality of first coordinates and a plurality of second coordinates, wherein each one of the plurality of second coordinates comprises one of the plurality of successively decreasing noise voltage magnitudes at a selected one of the plurality of successively increasing frequencies.

In accordance with still another embodiment of the presently claimed invention, a method of determining flicker noise of an amplifier circuit includes:

receiving, for at least a test time interval, an output voltage of an amplifier circuit as a time domain voltage signal with a magnitude distribution, a thermal noise voltage having a magnitude, and a flicker noise voltage having a profile;

digitizing at least a portion of the time domain voltage signal corresponding to the test time interval to provide a corresponding plurality of time domain signal data;

processing at least a portion of the plurality of time domain signal data corresponding to at least a portion of the test time interval to compute a time correlation parameter, a magnitude distribution parameter and a product of the time correlation and magnitude distribution parameters to produce a test coordinate; and comparing the test coordinate to a plurality of first coordinates to determine a corner frequency for the amplifier circuit flicker noise, wherein the plurality of first coordinates is computed by receiving, for at least a measurement time interval, another output voltage of one of a plurality of amplifier circuits as another time domain voltage signal with another magnitude distribution, another thermal noise voltage having a magnitude, and another flicker noise voltage having a profile, digitizing at least a portion of the another time domain voltage signal corresponding to the measurement time interval to provide another corresponding plurality of time domain signal data, processing the another plurality of time domain signal data in accordance with a Fast Fourier Transform (FFT) operation to compute at least a portion of the another flicker noise voltage profile below another corner frequency, wherein the another flicker noise voltage profile comprises a voltage versus frequency profile with each one of a plurality of successively decreasing noise voltage magnitudes at a respective one of a plurality of successively increasing frequencies, and a last one of the plurality of successively decreasing noise voltage magnitudes is at the another corner frequency and approximately equal to the another thermal noise voltage magnitude, processing a portion of the another plurality of time domain signal data corresponding to a portion of the measurement time interval to compute another time correlation parameter, another magnitude distribution parameter and another product of the another time correlation and magnitude distribution parameters to produce one of the plurality of first coordinates, and repeating the receiving, digitizing and processings for each one of the plurality of amplifier circuits to produce the plurality of first coordinates and a plurality of second coordinates, wherein each one of the plurality of second coordinates comprises the another corner frequency for a corresponding one of the plurality of amplifier circuits.

In accordance with yet another embodiment of the presently claimed invention, a method of determining flicker noise of an amplifier circuit includes:

receiving, for at least a test time interval, an output voltage of an amplifier circuit as a time domain voltage signal with a magnitude distribution, a thermal noise voltage having a magnitude, and a flicker noise voltage having a profile;

In accordance with a further embodiment of the presently claimed invention, a method of establishing a benchmark for a figure of merit indicative of flicker noise of an amplifier circuit includes:

receiving, for at least a measurement time interval, an output voltage of one of a plurality of amplifier circuits as a time domain voltage signal with a magnitude distribution, thermal noise voltage having a magnitude and flicker noise voltage having a profile;

digitizing at least a portion of the time domain voltage signal corresponding to the measurement time interval to provide a corresponding plurality of time domain signal data;

processing the plurality of time domain signal data in accordance with a first Fast Fourier Transform (FFM) operation to compute at least a portion of the flicker noise voltage profile below a corner frequency, wherein the flicker noise voltage profile comprises a voltage versus frequency profile with each one of a plurality of successively decreasing noise voltage magnitudes at a respective one of a plurality of successively increasing frequencies, and a last one of the plurality of successively decreasing noise voltage magnitudes is at the corner frequency and approximately equal to the thermal noise voltage magnitude;

processing a portion of the plurality of time domain signal data corresponding to a portion of the measurement time interval in accordance with a second FFT operation to produce one of a plurality of first coordinates; and repeating the receiving, digitizing and processings for each one of the plurality of amplifier circuits to produce the plurality of fist coordinates and a plurality of second coordinates, wherein each one of the plurality of first coordinates comprises one of the plurality of successively decreasing noise voltage magnitudes at a selected one of the plurality of successively increasing frequencies, and each one of the plurality of second coordinates comprises the corner frequency for a corresponding one of the plurality of amplifier circuits.

In accordance with a further embodiment of the presently claimed invention, a method of establishing a benchmark for a figure of merit indicative of flicker noise of an amplifier circuit includes:

receiving, for at least a measurement time interval, an output voltage of one of a plurality of amplifier circuits as a time domain voltage signal with a magnitude distribution, thermal noise voltage having a magnitude and flicker noise voltage having a profile;

digitizing at least a portion of the time domain voltage signal corresponding to the measurement time interval to provide a corresponding plurality of time domain signal data;

processing the plurality of time domain signal data in accordance with a first Fast Fourier Transform (FFT) operation to compute at least a portion of the flicker noise voltage profile below a corner frequency, wherein the flicker noise voltage profile comprises a voltage versus frequency profile with each one of a plurality of successively decreasing noise voltage magnitudes at a respective one of a plurality of successively increasing frequencies, and a last one of the plurality of successively decreasing noise voltage magnitudes is at the corner frequency and approximately equal to the then noise voltage magnitude;

processing a portion of the plurality of time domain signal data corresponding to a portion of the measurement time interval in accordance with a second FFT operation to produce one of a plurality of first coordinates; and repeating the receiving, digitizing and processings for each one of the plurality of amplifier circuits to produce the plurality of first coordinates and a plurality of second coordinates, wherein each one of the plurality of first coordinates comprises a first one of the plurality of successively decreasing noise voltage magnitudes at a selected one of the plurality of successively increasing frequencies, and each one of the plurality of second coordinates comprises a second one of the plurality of successively decreasing noise voltage magnitudes at the selected one of the plurality of successively increasing frequencies.

In accordance with a further embodiment of the presently claimed invention, a method of determining flicker noise of an amplifier circuit includes:

receiving, for at least a test time interval, an output voltage of an amplifier circuit as a time domain voltage signal with a magnitude distribution, a thermal noise voltage having a magnitude, and a flicker noise voltage having a profile;

digitizing at least a portion of the time domain voltage signal corresponding to the test time interval to provide a corresponding plurality of time domain signal data;

processing at least a portion of the plurality of time domain signal data corresponding to at least a portion of the test time interval to compute a time correlation parameter, a magnitude distribution parameter and a product of the time correlation and magnitude distribution parameters to produce a test coordinate; and comparing the test coordinate to a plurality of first coordinates to determine a corner frequency for the amplifier circuit flicker noise, wherein the plurality of first coordinates is computed by receiving, for at least a measurement time interval, another output voltage of one of a plurality of amplifier circuits as another time domain voltage signal with another magnitude distribution, another thermal noise voltage having a magnitude, and another flicker noise voltage having a profile, digitizing at least a portion of the another time domain voltage signal corresponding to the measurement time interval to provide another corresponding plurality of time domain signal data, processing the another plurality of time domain signal data in accordance with a first Fast Fourier Transform (FFT) operation to compute at least a portion of the another flicker noise voltage profile below another corner frequency, wherein the another flicker noise voltage profile comprises a voltage versus frequency profile with each one of a plurality of successively decreasing noise voltage magnitudes at a respective one of a plurality of successively increasing frequencies, and a last one of the plurality of successively decreasing noise voltage magnitudes is at the another corner frequency and approximately equal to the another thermal noise voltage magnitude, processing a portion of the plurality of time domain signal data corresponding to a portion of the measurement time interval in accordance with a second FFT operation to produce one of a plurality of first coordinates, and repeating the receiving, digitizing and processings for each one of the plurality of amplifier circuits to produce the plurality of first coordinates and a plurality of second coordinates, wherein each one of the plurality of first coordinates comprises one of the plurality of successively decreasing noise voltage magnitudes at a selected one of the plurality of successively increasing frequencies, and each one of the plurality of second coordinates comprises the corner frequency for a corresponding one of the plurality of amplifier circuits.

In accordance with a further embodiment of the presently claimed invention, a method of determining flicker noise of an amplifier circuit includes:

receiving, for at least a test time interval, an output voltage of an amplifier circuit as a time domain voltage signal with a magnitude distribution, a thermal noise voltage having a magnitude, and a flicker noise voltage having a profile;

digitizing at least a portion of the time domain voltage signal corresponding to the test time interval to provide a corresponding plurality of time domain signal data;

processing at least a portion of the plurality of time domain signal data corresponding to at least a portion of the test time interval to compute a time correlation parameter, a magnitude distribution parameter and a product of the time correlation and magnitude distribution parameters to produce a test coordinate; and comparing the test coordinate to a plurality of first coordinates to determine a noise voltage magnitude at a selected frequency for the amplifier circuit flicker noise, wherein the plurality of first coordinates is computed by receiving, for at least a measurement time interval, another output voltage of one of a plurality of amplifier circuits as another time domain voltage signal with another magnitude distribution, another thermal noise voltage having a magnitude, and another flicker noise voltage having a profile, digitizing at least a portion of the another time domain voltage signal corresponding to the measurement time interval to provide another corresponding plurality of time domain signal data, processing the another plurality of time domain signal data in accordance with a first Fast Fourier Transform (FFT) operation to compute at least a portion of the another flicker noise voltage profile below a corner frequency, wherein the another flicker noise voltage profile comprises a voltage versus frequency profile with each one of a plurality of successively decreasing noise voltage magnitudes at a respective one of a plurality of successively increasing frequencies, and a last one of the plurality of successively decreasing noise voltage magnitudes is at the corner frequency and approximately equal to the another thermal noise voltage magnitude, processing a portion of the plurality of time domain signal data corresponding to a portion of the measurement time interval in accordance with a second FFT operation to produce one of a plurality of first coordinates, and repeating the receiving, digitizing and processings for each one of the plurality of amplifier circuits to produce the plurality of first coordinates and a plurality of second coordinates, wherein each one of the plurality of first coordinates comprises a firt one of the plurality of successively decreasing noise voltage magnitudes at a selected one of the plurality of successively increasing frequencies, and each one of the plurality of second coordinates comprises a second one of the plurality of successively decreasing noise voltage magnitudes at the selected one of the plurality of successively increasing frequencies.

digitizing at least a portion of the time domain voltage signal corresponding to the test time interval to provide a corresponding plurality of time domain signal data;

processing at least a portion of the plurality of time domain signal data corresponding to at least a portion of the test time interval to compute a time correlation parameter, a magnitude distribution parameter and a product of the time correlation and magnitude distribution parameters to produce a test coordinate; and comparing the test coordinate to a plurality of first coordinates to determine a noise voltage magnitude at a selected frequency for the amplifier circuit flicker noise, wherein the plurality of first coordinates is computed by receiving, for at least a measurement time interval, another output voltage of one of a plurality of amplifier circuits as another time domain voltage signal with another magnitude distribution, another thermal noise voltage having a magnitude, and another flicker noise voltage having a profile, digitizing at least a portion of the another time domain voltage signal corresponding to the measurement time interval to provide another corresponding plurality of time domain signal data, processing the another plurality of time domain signal data in accordance with a Fast Fourier Transform (FFT) operation to compute at least a portion of the another flicker noise voltage profile below a corner frequency, wherein the another flicker noise voltage profile comprises a voltage versus frequency profile with each one of a plurality of successively decreasing noise voltage magnitudes at a respective one of a plurality of successively increasing frequencies, and a last one of the plurality of successively decreasing noise voltage magnitudes is at the corner frequency and approximately equal to the another thermal noise voltage magnitude, processing a portion of the another plurality of time domain signal data corresponding to a portion of the measurement time interval to compute another time correlation parameter, another magnitude distribution parameter and another product of the another time correlation and magnitude distribution parameters to produce one of the plurality of first coordinates, and repeating the receiving, digitizing and processings for each one of the plurality of amplifier circuits to produce the plurality of first coordinates and a plurality of second coordinates, wherein each one of the plurality of second coordinates comprises one of the plurality of successively decreasing noise voltage magnitudes at a selected one of the plurality of successively increasing frequencies.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

Figure 1:
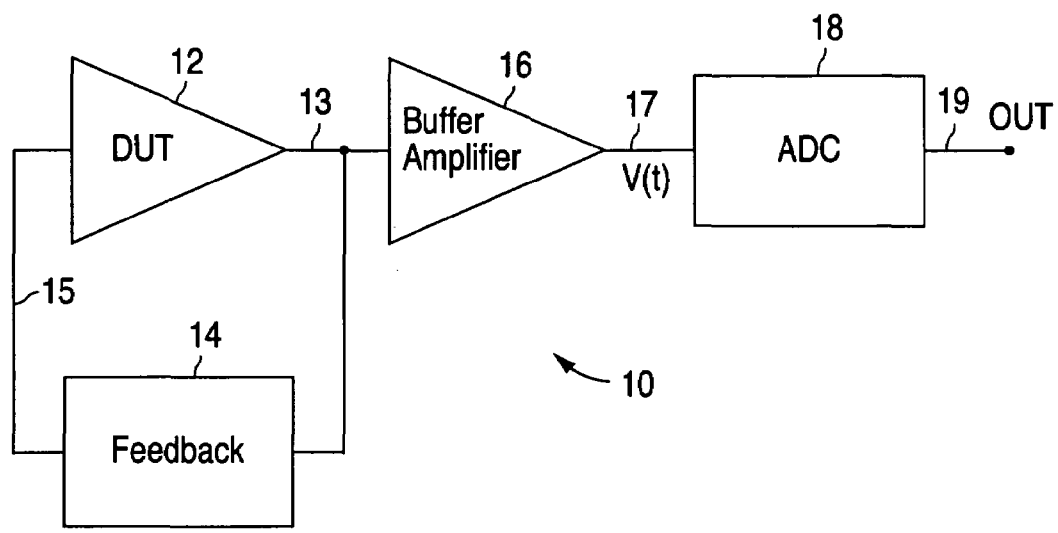
FIG. 1 is a functional block diagram of a conventional test setup for measuring noise of a device under test (DUT).

Referring to FIG. 1, a conventional test setup for measuring noise of a device under test (DUT) 12 involves providing feedback 14 for the DUT 12 for feeding back at least a portion of the output signal 13 as an input signal 15 for the DUT 12. The output signal 13 of the DUT 12 is also buffered by a buffer amplifier 16, with the buffered signal 17 being converted to a digital signal 19 by an analog-to-digital converter (ADC) circuit 18. This output signal 19 is then made available for measurements and processing by test equipment (not shown), typically in the form of ATE.

Figure 2:
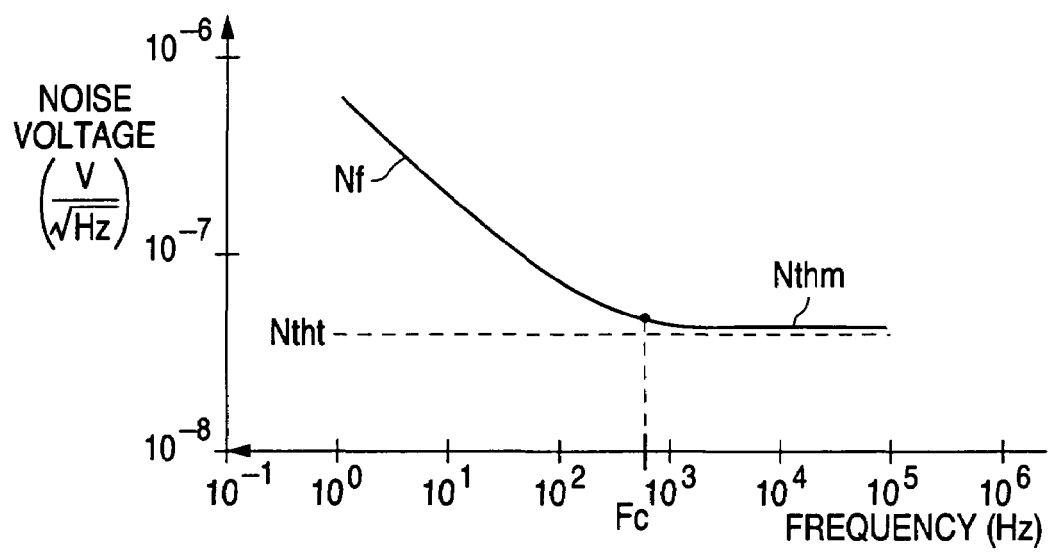
FIG. 2 is a graph of noise voltage versus frequency for a typical analog amplifier circuit.

Referring to FIG. 2, it is well known that the noise spectrum for the output of an amplifier circuit can be represented as shown, i.e., volts per the square root of frequency as a function of frequency, with flicker noise Nf being dominant below the corner frequency Fc, and thermal noise Nth being dominant above the corner frequency Fc (where the measured thermal noise Nthm may be slightly higher than the theoretical thermal noise Ntht).

As is well known, the noise in a semiconductor device can be analyzed by the spectral content of a time-dependent voltage signal V(t). The FFT of the time domain voltage signal produces the noise spectral density S(f) function according to Equation 1 (where T is the total sampling time and f is frequency):

Eq. 1:
$$S(f) = \frac{1}{T^2} \left| \int_0^T V(t) e^{j2\pi f \cdot t} dt \right|^2$$

As is well known, thermal noise produces a constant noise spectral density S(f), while flicker noise produces a noise spectral density S(f) approximately equal to the inverse of the frequency f raised to the exponent $\beta$ ($1/f^\beta$).

The LAG 1 autocorrelation function (ACF) of a time-dependent signal V(t) can also be used to identify the type of signal, such as the thermal or flicker noise. This LAG 1 ACF can be expressed according to Equation 2 (where $\tau$ is the time delay used to determine the autocorrelation):

Eq. 2:
$$\Phi(\tau) = \frac{1}{T} \int_0^T V(t) V(t + \tau) dt$$

Since the power spectral density S(f) and correlation of a signal are related to each other through a Fourier Transform, the ACF can be used to determine the level of flicker noise within a signal, i.e., distinct from the thermal noise within the signal. This can be done by computing the LAG 1 autocorrelation phase in accordance with Equations 3 and 4:

$$V(t+\tau)=\Theta[V(t)] \quad \text{Eq. 3}$$

$$\Theta(V)=\alpha+\rho \cdot V \quad \text{Eq. 4}$$

In these functions, the slope ρ and intercept α of the phase function θ(V) are determined by the type of noise in accordance with Equations 5 and 6 (where <θ> is the mean of the phase function):

$$\alpha/<\Theta>=1 \& \rho=0 \quad \text{Eq. 5}$$

$$\alpha/<\Theta>\approx 0 \& \rho\approx 1 \quad \text{Eq. 6}$$

Figure 3A:
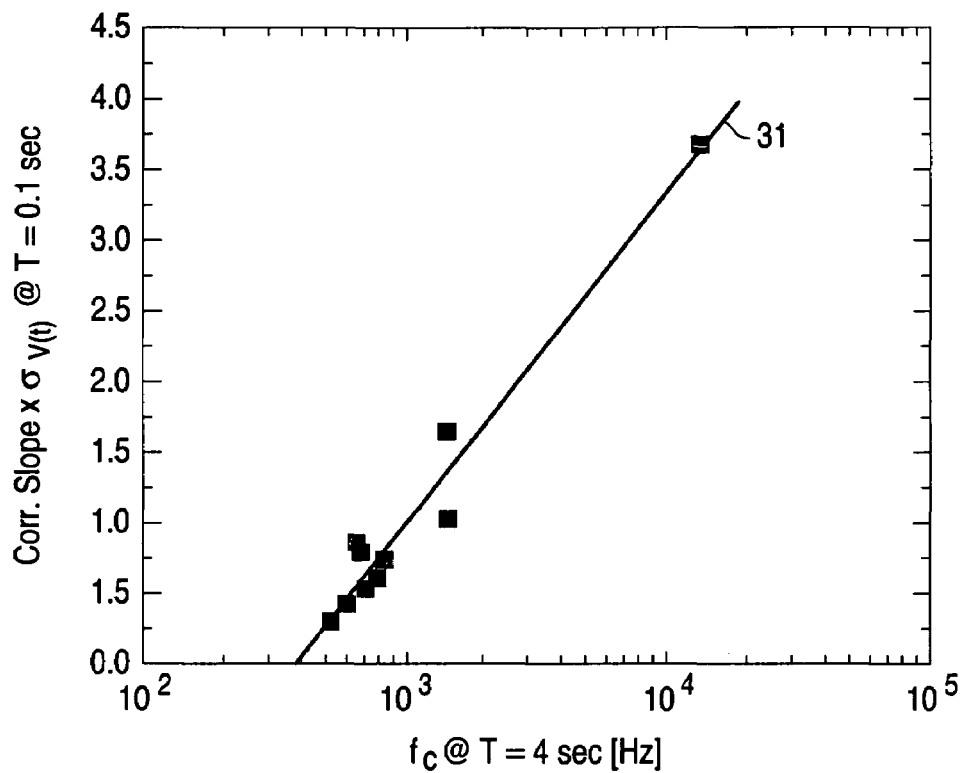
FIGS. 3A and 3B are semi-logarithmic graphs of time correlation and magnitude distribution parameters versus noise corner frequency, computed in accordance with at least one embodiment of the presently claimed invention.
Figure 3B:
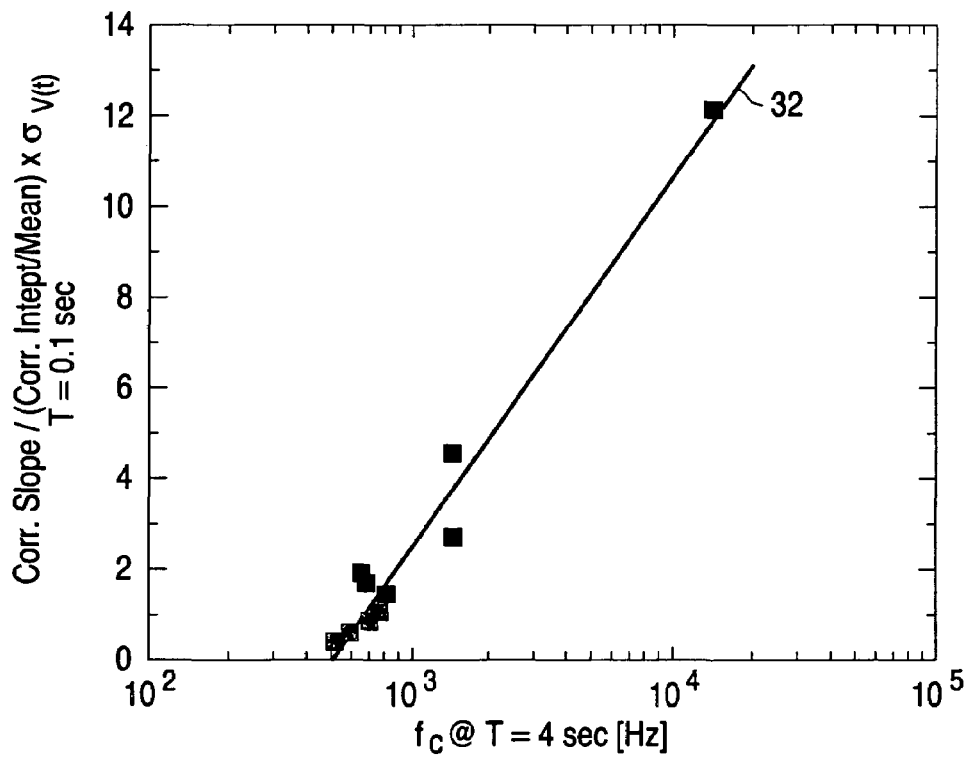

Referring to FIGS. 3A and 3B, these principles can be advantageously applied in accordance with the presently claimed invention as follows. First, a selected number of samples (e.g., 1,000) of amplifier circuits can be tested as depicted in FIG. 1. By processing the sampled test data in accordance with a FFT operation for a long sampling time interval (e.g., four seconds) for each unit, the corner frequency can be determined. Second, for each DUT 12, the sampled data for a short sampling time interval (e.g., 0.1 second) can be processed in accordance with the LAG 1 ACF, for which the correlation slope ρ can be determined. Third, a magnitude distribution parameter, e.g., the standard deviation σ, of the magnitude of the sampled voltage signal can be computed.

As shown in FIG. 3A, for each DUT 12, the product of the correlation slope ρ and standard deviation σ of the sampled voltage signal can be plotted against the measured corner frequencies. When this is done for all sampled units, a plot line 31 is produced. As shown in FIG. 3B, a similar plot line 32 can be produced by plotting, also against the computed corner frequencies, a parameter computed as a combination of the correlation slope p, correlation intercept α, correlation mean <θ>, and the standard deviation σ of the magnitude of the sampled voltage signal $(\rho/\alpha/<\theta>)*\sigma_{v(t)}$.

Figure 4A:
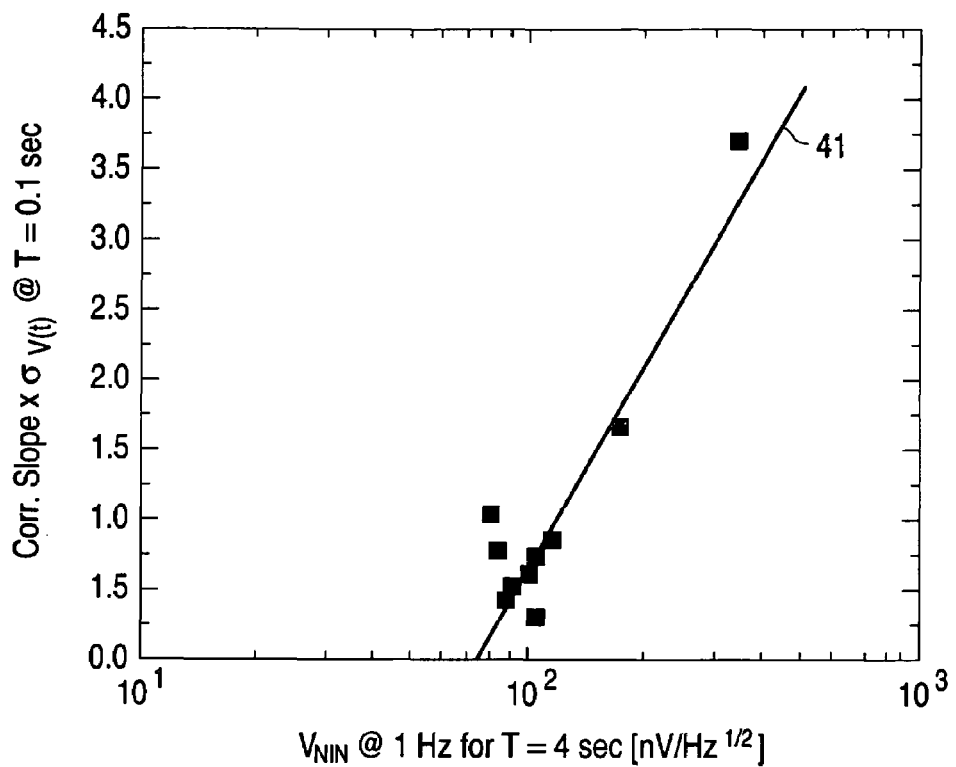
FIGS. 4A and 4B are semi-logarithmic graphs of time correlation and magnitude distribution parameters versus input noise voltage, computed in accordance with at least one other embodiment of the presently claimed invention.
Figure 4B:
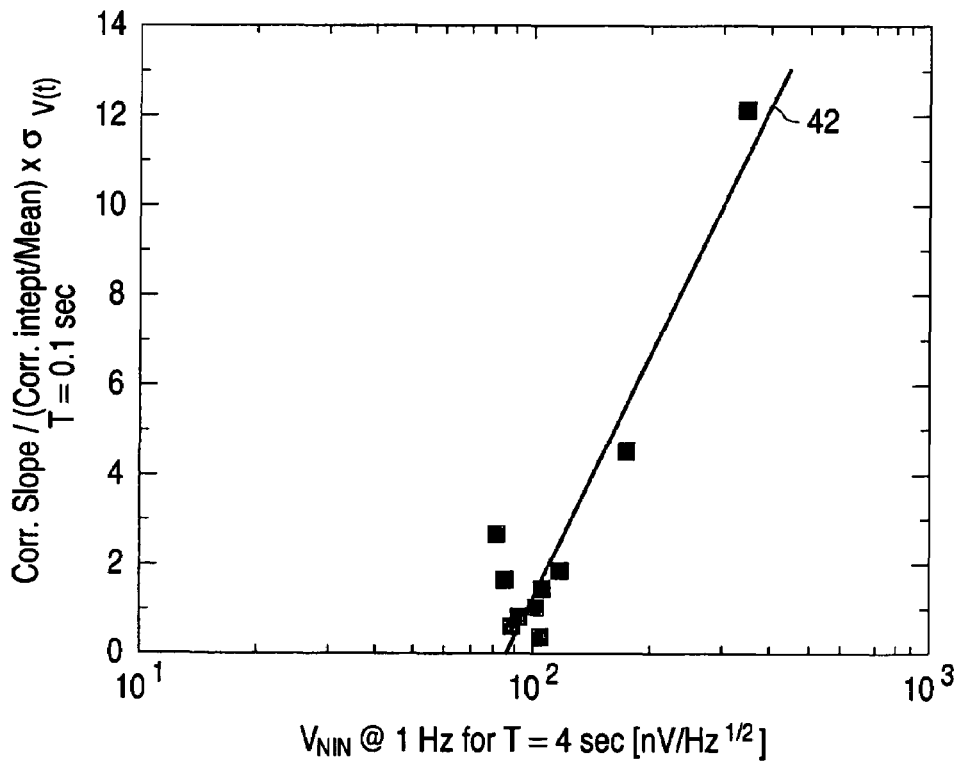

Referring to FIGS. 4A and 4B, plot lines 41, 42 corresponding to those of FIGS. 3A and 3B, respectively, can also be computed where the abscissa is the computed input noise voltages at one Hertz for a sampling time interval (for FFT purposes) of four seconds.

Figure 5A:
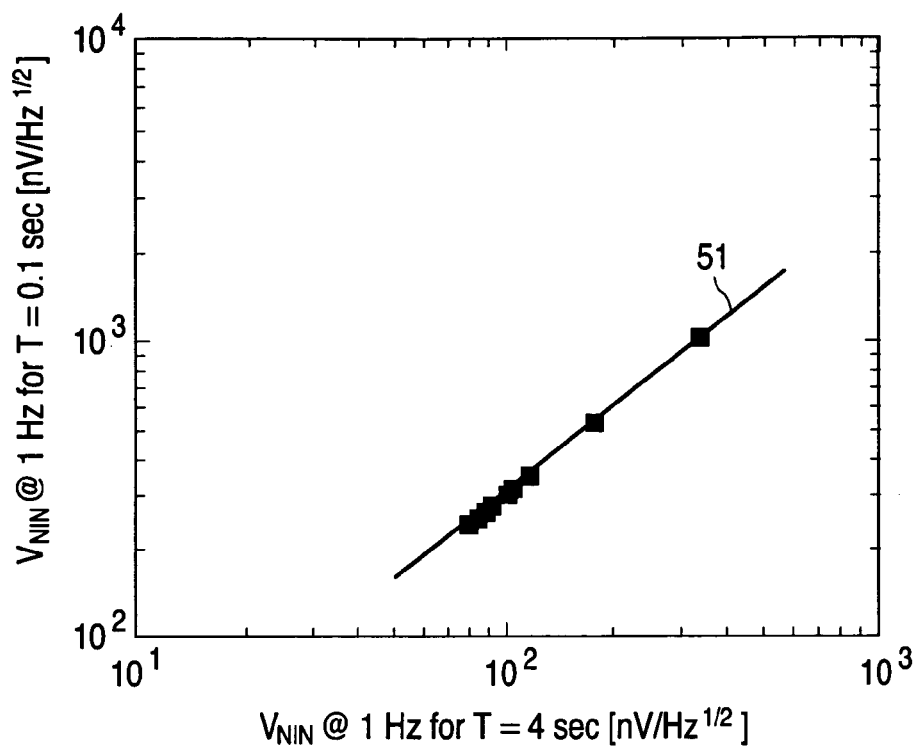
FIGS. 5A and 5B are logarithmic graphs of FFT-derived noise voltage versus input noise voltage and noise corner frequency, respectively, computed in accordance with at least one additional embodiment of the presently claimed invention.
Figure 5B:
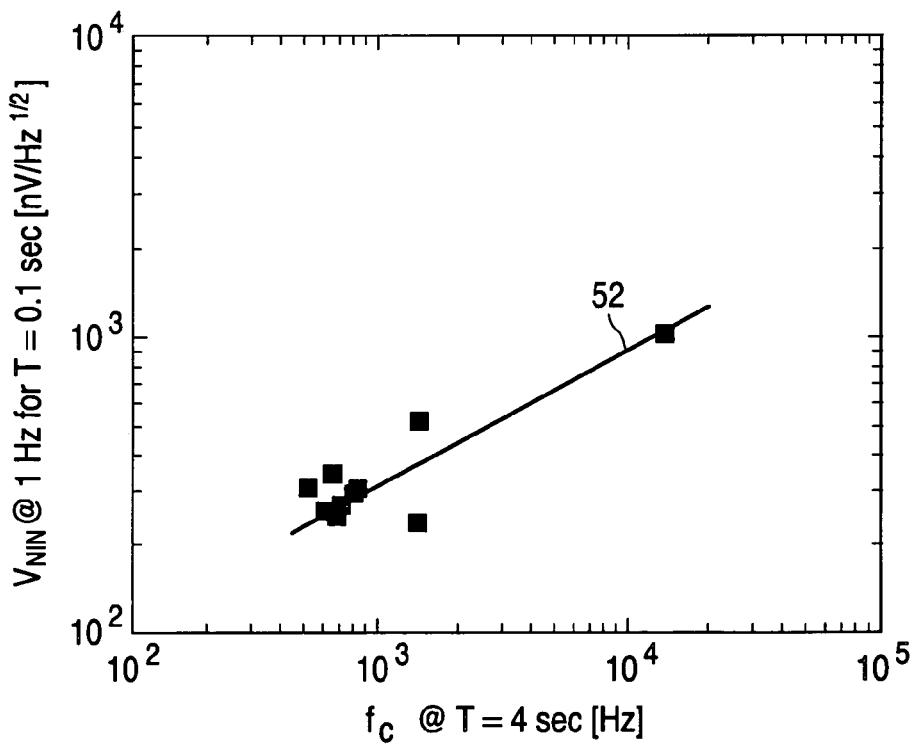

Referring to FIGS. 5A and 5B, plot lines 51, 52 corresponding to those of FIGS. 3A, 3B, 4A and 4B can also be computed. Here the abscissas are the computed input noise voltage at one Hertz (FIG. 5A) and noise corner frequency (FIG. 5B) for a sampling time interval (for FFT purposes) of four seconds, while the ordinates are the computed input noise voltage at one Hertz for a shorter sampling time interval (for FFT purposes) of 0.1 second.

Subsequently, during testing in a production environment, the units being tested need only have their output voltage sampled for the shorter sampling time interval (e.g., 0.1 second) for use in computation using the ACF or FFT. By comparing the results of these tests, such as those represented by the square symbols in FIGS. 3A, 3B, 4A, 4B, 5A and 5B, against the previously computed plot lines 31, 32, 41, 42, 51, 52 the corner frequency or equivalent input noise can be determined with a relatively high degree of accuracy.

Figure 6:
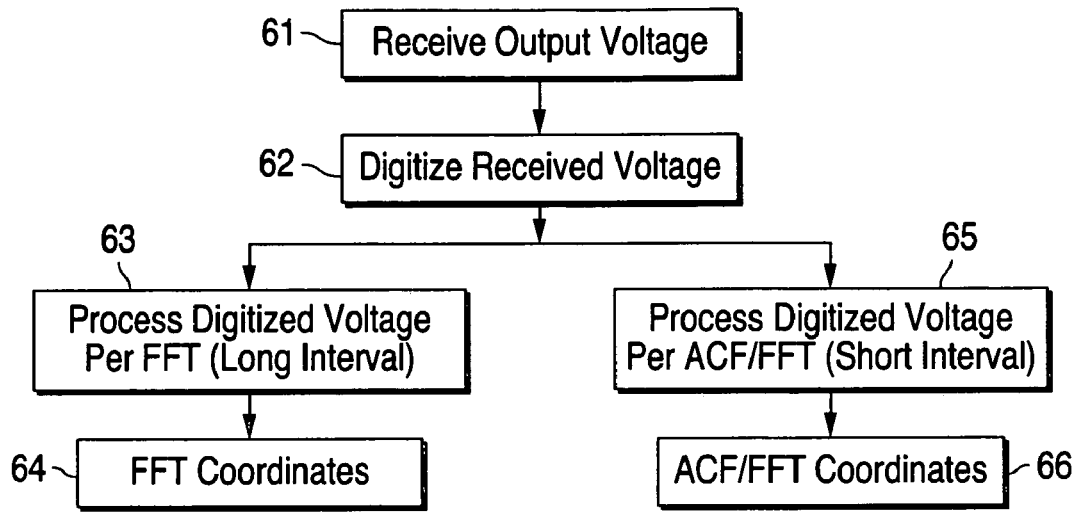
FIG. 6 depicts a method of establishing a benchmark for a figure of merit indicative of flicker noise of an amplifier circuit in accordance with one embodiment of the presently claimed invention.

Referring to FIG. 6, the method for establishing the plot lines of FIGS. 3A, 3B, 4A, 4B, 5A and 5B can be summarized as shown. As a first step 61, the output voltage of the DUT 12 (FIG. 1) is received, followed by a step 62 in which the received voltage is digitized. In a subsequent step 63, the digitized voltage is processed according to an FFT to produce the FFT-derived data for a longer sampling time interval, as discussed above. Also subsequent to the digitization 62, is a step 65 in which the digitized voltage is processed according to the ACF or FFT to produce the ACF- or FFT-derived data for a shorter sampling time interval, as discussed above.

Figure 7:
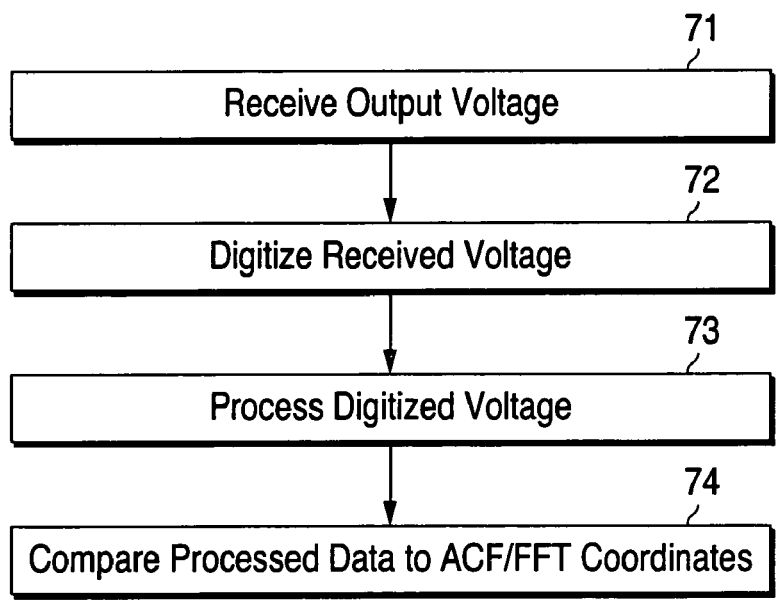
FIG. 7 depicts a method for testing flicker noise of amplifier circuits using a benchmark established as depicted in FIG. 6.

Referring to FIG. 7, the use of the plot lines in FIGS. 3A, 3B, 4A, 4B, 5A and 5B can be used in production testing, as discussed above, by receiving the output voltage in a first step 71, followed by a step 72 in which the received voltage is digitized. In a following step 73, the digitized voltage is processed using the ACF or FFT, following which in another step 74 the processed data is compared to the ACF- or FFT-derived data of the plot lines computed, as discussed above.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. A method of establishing a benchmark for a figure of merit indicative of flicker noise of an amplifier circuit, comprising:

receiving, for at least a measurement time interval, an output voltage of one of a plurality of amplifier circuits as a time domain voltage signal with a magnitude distribution, thermal noise voltage having a magnitude and flicker noise voltage having a profile;

digitizing at least a portion of said time domain voltage signal corresponding to said measurement time interval to provide a corresponding plurality of time domain signal data;

processing said plurality of time domain signal data in accordance with a Fast Fourier Transform (FFT) operation to compute at least a portion of said flicker noise voltage profile below a corner frequency, wherein said flicker noise voltage profile comprises a voltage versus frequency profile with each one of a plurality of successively decreasing noise voltage magnitudes at a respective one of a plurality of successively increasing frequencies, and a last one of said plurality of successively decreasing noise voltage magnitudes is at said corner frequency and approximately equal to said thermal noise voltage magnitude;

processing a portion of said plurality of time domain signal data corresponding to a portion of said measurement time interval to compute a time correlation parameter, a magnitude distribution parameter and a product of said time correlation and magnitude distribution parameters to produce one of a plurality of first coordinates; and repeating said receiving, digitizing and processings for each one of said plurality of amplifier circuits to produce said plurality of first coordinates and a plurality of second coordinates, wherein each one of said plurality of second coordinates comprises said corner frequency for a corresponding one of said plurality of amplifier circuits.

2. The method of claim 1, wherein said processing said plurality of time domain signal data in accordance with a FFT operation comprises computing a noise spectral density expressed substantially as $S(f)=(1/T)^2 * |\int_0^T (V(t)e^{j2\pi ft}dt)|^2$, wherein T is said measurement time interval in seconds, t is time in seconds, and f is frequency in Hertz.

3. The method of claim 1, wherein said processing a portion of said plurality of time domain signal data corresponding to a portion of said measurement time interval to compute a time correlation parameter comprises processing said portion of said plurality of time domain signal data to compute a LAG 1 autocorrelation function including an intercept and a slope.

4. The method of claim 3, wherein said processing said portion of said plurality of time domain signal data to compute a LAG 1 autocorrelation function including an intercept and a slope comprises computing a LAG 1 autocorrelation function expressed substantially as $\Phi(\tau)=(1/T)*\int_0^T (V(t)V(t+\Sigma)dt)$, wherein $\tau$ is a time delay in seconds.

5. The method of claim 1, wherein said processing a portion of said plurality of time domain signal data corresponding to a portion of said measurement time interval to compute a magnitude distribution parameter comprises processing said portion of said plurality of time domain signal data to compute a standard deviation of said time domain voltage signal magnitude distribution.

6. The method of claim 1, wherein said processing a portion of said plurality of time domain signal data corresponding to a portion of said measurement time interval to compute a product of said time correlation and magnitude distribution parameters comprises processing said portion of said plurality of time domain signal data to compute:
   a LAG 1 autocorrelation function including an intercept and a slope;
   a standard deviation of said time domain voltage signal magnitude distribution; and
   a product of said standard deviation and one or more parameters including at least one of said slope and an inverse of said intercept.

7. The method of claim 6, wherein said processing said portion of said plurality of time domain signal data to compute a product of said standard deviation and one or more parameters including at least one of said slope and an inverse of said intercept comprises computing a product expressed substantially as $(\sigma*\rho)/(\alpha/<\theta>)$, wherein $\sigma$ is said standard deviation, $\rho$ is said slope, $\alpha$ is said intercept, and $<\theta>$ is a mean of said LAG 1 autocorrelation function.

8. A method of establishing a benchmark for a figure of merit indicative of flicker noise of an amplifier circuit, comprising:
   receiving, for at least a measurement time interval, an output voltage of one of a plurality of amplifier circuits as a time domain voltage signal with a magnitude distribution, thermal noise voltage having a magnitude and flicker noise voltage having a profile;
   digitizing at least a portion of said time domain voltage signal corresponding to said measurement time interval to provide a corresponding plurality of time domain signal data;
   processing said plurality of time domain signal data in accordance with a Fast Fourier Transform (FFT) operation to compute at least a portion of said flicker noise voltage profile below a corner frequency, wherein said flicker noise voltage profile comprises a voltage versus frequency profile with each one of a plurality of successively decreasing noise voltage magnitudes at a respective one of a plurality of successively increasing frequencies, and a last one of said plurality of successively decreasing noise voltage magnitudes is at said corner frequency and approximately equal to said thermal noise voltage magnitude;
   processing a portion of said plurality of time domain signal data corresponding to a portion of said measurement time interval to compute a time correlation parameter, a magnitude distribution parameter and a product of said time correlation and magnitude distribution parameters to produce one of a plurality of first coordinates; and
   repeating said receiving, digitizing and processings for each one of said plurality of amplifier circuits to produce said plurality of first coordinates and a plurality of second coordinates, wherein each one of said plurality of second coordinates comprises one of said plurality of successively decreasing noise voltage magnitudes at a selected one of said plurality of successively increasing frequencies.

9. The method of claim 8, wherein said processing said plurality of time domain signal data in accordance with a FFT operation comprises computing a noise spectral density expressed substantially as $S(f)=(1/T^2)* |\int_0^T (V(t)e^{j2\pi ft}dt)|^2$, wherein T is said measurement time interval in seconds, t is time in seconds, and f is frequency in Hertz.

10. The method of claim 8, wherein said processing a portion of said plurality of time domain signal data corresponding to a portion of said measurement time interval to compute a time correlation parameter comprises processing said portion of said plurality of time domain signal data to compute a LAG 1 autocorrelation function including an intercept and a slope.

11. The method of claim 10, wherein said processing said portion of said plurality of time domain signal data to compute a LAG 1 autocorrelation function including an intercept and a slope comprises computing a LAG 1 autocorrelation function expressed substantially as $\Phi(\tau)=(1/T)*\int_0^T (V(t)V(t+\tau)dt)$, wherein $\tau$ is a tine delay in seconds.

12. The method of claim 8, wherein said processing a portion of said plurality of time domain signal data corresponding to a portion of said measurement time interval to compute a magnitude distribution parameter comprises processing said portion of said plurality of time domain signal data to compute a standard deviation of said time domain voltage signal magnitude distribution.

13. The method of claim 8, wherein said processing a portion of said plurality of time domain signal data corresponding to a portion of said measurement time interval to compute a product of said time correlation and magnitude distribution parameters comprises processing said portion of said plurality of time domain signal data to compute:
   a LAG 1 autocorrelation function including an intercept and a slope;
   a standard deviation of said time domain voltage signal magnitude distribution; and
   a product of said standard deviation and one or more parameters including at least one of said slope and an inverse of said intercept.

14. The method of claim 13, wherein said processing said portion of said plurality of time domain signal data to compute a product of said standard deviation and one or more parameters including at least one of said slope and an inverse of said intercept comprises computing a product expressed substantially as $(\sigma*\rho)/(\alpha/<\theta>)$, wherein $\sigma$ is said standard deviation, $\rho$ is said slope, $\alpha$ is said intercept, and $<\theta>$ is a mean of said LAG 1 autocorrelation function.

15. A method of determining flicker noise of an amplifier circuit, comprising:

receiving, for at least a test time interval, an output voltage of an amplifier circuit as a time domain voltage signal with a magnitude distribution, a thermal noise voltage having a magnitude, and a flicker noise voltage having a profile;

digitizing at least a portion of said time domain voltage signal corresponding to said test time interval to provide a corresponding plurality of time domain signal data;

processing at least a portion of said plurality of time domain signal data corresponding to at least a portion of said test time interval to compute a time correlation parameter, a magnitude distribution parameter and a product of said time correlation and magnitude distribution parameters to produce a test coordinate; and comparing said test coordinate to a plurality of fist coordinates to determine a corner frequency for said amplifier circuit flicker noise, wherein said plurality of first coordinates, is computed by receiving, for at least a measurement time interval, another output voltage of one of a plurality of amplifier circuits as another time domain voltage signal with another magnitude distribution, another thermal noise voltage having a magnitude, and another flicker noise voltage having a profile, digitizing at least a portion of said another time domain voltage signal corresponding to said measurement time interval to provide another corresponding plurality of time domain signal data, processing said another plurality of time domain signal data in accordance with a Fast Fourier Transform (FFT) operation to compute at least a portion of said another flicker noise voltage profile below another corner frequency, wherein said another flicker noise voltage profile comprises a voltage versus frequency profile with each one of a plurality of successively decreasing noise voltage magnitudes at a respective one of a plurality of successively increasing frequencies, and a last one of said plurality of successively decreasing noise voltage magnitudes is at said another corner frequency and approximately equal to said another thermal noise voltage magnitude, processing a portion of said another plurality of time domain signal data corresponding to a portion of said measurement time interval to compute another time correlation parameter, another magnitude distribution parameter and another product of said another time correlation and magnitude distribution parameters to produce one of said plurality of first coordinates, and repeating said receiving, digitizing and processings for each one of said plurality of amplifier circuits to produce said plurality of first coordinates and a plurality of second coordinates, wherein each one of said plurality of second coordinates comprises said another corner frequency for a corresponding one of said plurality of amplifier circuits.

16. The method of claim 15, wherein said processing a portion of said plurality of time domain signal data corresponding to a portion of said measurement time interval to compute a time correlation parameter comprises processing said portion of said plurality of time domain signal data to compute a LAG 1 autocorrelation function including an intercept and a slope.

17. The method of claim 15, wherein said processing a portion of said plurality of time domain signal data corresponding to a portion of said measurement time interval to compute a magnitude distribution parameter comprises processing said portion of said plurality of time domain signal data to compute a standard deviation of said time domain voltage signal magnitude distribution.

18. A method of determining flicker noise of an amplifier circuit, comprising:

receiving, for at least a test time interval, an output voltage of an amplifier circuit as a time domain voltage signal with a magnitude distribution, a thermal noise voltage having a magnitude, and a flicker noise voltage having a profile;

digitizing at least a portion of said time domain voltage signal corresponding to said test time interval to provide a corresponding plurality of time domain signal data;

processing at least a portion of said plurality of time domain signal data corresponding to at least a portion of said test time interval to compute a time correlation parameter, a magnitude distribution parameter and a product of said time correlation and magnitude distribution parameters to produce a test coordinate; and comparing said test coordinate to a plurality of first coordinates to determine a noise voltage magnitude at a selected frequency for said amplifier circuit flicker noise, wherein said plurality of first coordinates is computed by receiving, for at least a measurement time interval, another output voltage of one of a plurality of amplifier circuits as another time domain voltage signal with another magnitude distribution, another thermal noise voltage having a magnitude, and another flicker noise voltage having a profile, digitizing at least a portion of said another time domain voltage signal corresponding to said measurement time interval to provide another corresponding plurality of time domain signal data, processing said another plurality of time domain signal data in accordance with a Fast Fourier Transform (FFT) operation to compute at least a portion of said another flicker noise voltage profile below a corner frequency, wherein said another flicker noise voltage profile comprises a voltage versus frequency profile with each one of a plurality of successively decreasing noise voltage magnitudes at a respective one of a plurality of successively increasing frequencies, and a last one of said plurality of successively decreasing noise voltage magnitudes is at said corner frequency and approximately equal to said another thermal noise voltage magnitude, processing a portion of said another plurality of time domain signal data corresponding to a portion of said measurement time interval to compute another time correlation parameter, another magnitude distribution parameter and another product of said another time correlation and magnitude distribution parameters to produce one of said plurality of first coordinates, and repeating said receiving, digitizing and processings for each one of said plurality of amplifier circuits to produce said plurality of first coordinates and a plurality of second coordinates, wherein each one of said plurality of second coordinates comprises one of said plurality of successively decreasing noise voltage magnitudes at a selected one of said plurality of successively increasing frequencies.

19. The method of claim 18, wherein said processing a portion of said plurality of time domain signal data corresponding to a portion of said measurement time interval to compute a time correlation parameter comprises processing said portion of said plurality of time domain signal data to compute a LAG 1 autocorrelation function including an intercept and a slope.

20. The method of claim 18, wherein said processing a portion of said plurality of time domain signal data corresponding to a portion of said measurement time interval to compute a magnitude distribution parameter comprises processing said portion of said plurality of time domain signal data to compute a standard deviation of said time domain voltage signal magnitude distribution.

21. A method of establishing a benchmark for a figure of merit indicative of flicker noise of an amplifier circuit comprising:

receiving, for at least a measurement time interval, an output voltage of one of a plurality of amplifier circuits as a time domain voltage signal with a magnitude distribution, thermal noise voltage having a magnitude and flicker noise voltage having a profile;

digitizing at least a portion of said time domain voltage signal corresponding to said measurement time interval to provide a corresponding plurality of time domain signal data;

processing said plurality of time domain signal data in accordance with a first Fast Fourier Transform (FFT) operation to compute at least a portion of said flicker noise voltage profile below a corner frequency, wherein said flicker noise voltage profile comprises a voltage versus frequency profile with each one of a plurality of successively decreasing noise voltage magnitudes at a respective one of a plurality of successively increasing frequencies, and a last one of said plurality of successively decreasing noise voltage magnitudes is at said corner frequency and approximately equal to said thermal noise voltage magnitude;

processing a portion of said plurality of time domain signal data corresponding to a portion of said measurement time interval in accordance with a second FFT operation to produce one of a plurality of first coordinates; and repeating said receiving, digitizing and processings for each one of said plurality of amplifier circuits to produce said plurality of first coordinates and a plurality of second coordinates, wherein each one of said plurality of first coordinates comprises one of said plurality of successively decreasing noise voltage magnitudes at a selected one of said plurality of successively increasing frequencies, and each one of said plurality of second coordinates comprises said corner frequency for a corresponding one of said plurality of amplifier circuits.

22. The method of claim 21, wherein said processing said plurality of time domain signal data in accordance with a first FFT operation comprises computing a noise spectral density expressed substantially as $S(f)=(1/T^2)*|\int_0^T (V(t) e^{j2\pi f t} dt)|^2$, wherein T is said measurement time interval in seconds, t is time in seconds, and f is frequency in Hertz.

23. The method of claim 21, wherein said processing said plurality of time domain signal data in accordance with a second FFT operation comprises computing a noise spectral density expressed substantially as $S(f)=(1/T^2)*|\int_0^T (V(t) e^{j2\pi f t} dt)|^2$, wherein T is said measurement time interval in seconds, t is time in seconds, and f is frequency in Hertz.

24. A method of establishing a benchmark for a figure of merit indicative of flicker noise of an amplifier circuit, comprising:

receiving, for at least a measurement time interval, an output voltage of one of a plurality of amplifier circuits as a time domain voltage signal with a magnitude distribution, thermal noise voltage having a magnitude and flicker noise voltage having a profile;

digitizing at least a portion of said time domain voltage signal corresponding to said measurement time interval to provide a corresponding plurality of time domain signal data;

processing said plurality of time domain signal data in accordance with a fist Fast Fourier Transform (FFT) operation to compute at least a portion of said flicker noise voltage profile below a corner frequency, wherein said flicker noise voltage profile comprises a voltage versus frequency profile with each one of a plurality of successively decreasing noise voltage magnitudes at a respective one of a plurality of successively increasing frequencies, and a last one of said plurality of successively decreasing noise voltage magnitudes is at said corner frequency and approximately equal to said thermal noise voltage magnitude;

processing a portion of said plurality of time domain signal data corresponding to a portion of said measurement time interval in accordance with a second FFT operation to produce one of a plurality of first coordinates; and repeating said receiving, digitizing and processings for each one of said plurality of amplifier circuits to produce said plurality of first coordinates and a plurality of second coordinates, wherein each one of said plurality of first coordinates comprises a first one of said plurality of successively decreasing noise voltage magnitudes at a selected one of said plurality of successively increasing frequencies, and each one of said plurality of second coordinates comprises a second one of said plurality of successively decreasing noise voltage magnitudes at said selected one of said plurality of successively increasing frequencies.

25. The method of claim 24, wherein said processing said plurality of time domain signal data in accordance with a first FFT operation comprises computing a noise spectral density expressed substantially as $S(f)=(1/T^2)*|\int_0^T (V(t) e^{j2\pi f t} dt)|^2$, wherein T is said measurement time interval in seconds, t is time in seconds, and f is frequency in Hertz.

26. The method of claim 24, wherein said processing said plurality of time domain signal data in accordance with a second FFT operation comprises computing a noise spectral density expressed substantially as $S(f)=(1/T^2)*|\int_0^T (V(t) e^{j2\pi f t} dt)|^2$, wherein T is said measurement time interval in seconds, t is time in seconds, and f is frequency in Hertz.

27. A method of determining flicker noise of an amplifier circuit, comprising:

receiving for at least a test time interval, an output voltage of an amplifier circuit as a time domain voltage signal with a magnitude distribution, a thermal noise voltage having a magnitude, and a flicker noise voltage having a profile;

digitizing at least a portion of said time domain voltage signal corresponding to said test time interval to provide a corresponding plurality of time domain signal data;

processing at least a portion of said plurality of time domain signal data corresponding to at least a portion of said test time interval to compute a time correlation parameter, a magnitude distribution parameter and a product of said time correlation and magnitude distribution parameters to produce a test coordinate; and comparing said test coordinate to a plurality of first coordinates to determine a corner frequency for said amplifier circuit flicker noise, wherein said plurality of first coordinates is computed by receiving, for at least a measurement time interval, another output voltage of one of a plurality of amplifier circuits as another time domain voltage signal with another magnitude distribution, another thermal noise voltage having a magnitude, and another flicker noise voltage having a profile, digitizing at least a portion of said another time domain voltage signal corresponding to said measurement time interval to provide another corresponding plurality of time domain signal data, processing said another plurality of time domain signal data in accordance with a first Fast Fourier Transform (FFT) operation to compute at least a portion of said another flicker noise voltage profile below another corner frequency, wherein said another flicker noise voltage profile comprises a voltage versus frequency profile with each one of a plurality of successively decreasing noise voltage magnitudes at a respective one of a plurality of successively increasing frequencies, and a last one of said plurality of successively decreasing noise voltage magnitudes is at said another corner frequency and approximately equal to said another thermal noise voltage magnitude, processing a portion of said plurality of time domain signal data corresponding to a portion of said measurement time interval in accordance with a second FFT operation to produce one of a plurality of first coordinates, and repeating said receiving, digitizing and processings for each one of said plurality of amplifier circuits to produce said plurality of first coordinates and a plurality of second coordinates, wherein each one of said plurality of first coordinates comprises one of said plurality of successively decreasing noise voltage magnitudes at a selected one of said plurality of successively increasing frequencies, and each one of said plurality of second coordinates comprises said corner frequency for a corresponding one of said plurality of amplifier circuits.

28. A method of determining flicker noise of an amplifier circuit, comprising:

receiving, for at least a test time interval, an output voltage of an amplifier circuit as a time domain voltage signal with a magnitude distribution, a thermal noise voltage having a magnitude, and a flicker noise voltage having a profile;

digitizing at least a portion of said time domain voltage signal corresponding to said test time interval to provide a corresponding plurality of time domain signal data;

processing at least a portion of said plurality of time domain signal data corresponding to at least a portion of said test time interval to compute a time correlation parameter, a magnitude distribution parameter and a product of said time correlation and magnitude distribution parameters to produce a test coordinate; and comparing said test coordinate to a plurality of first coordinates to determine a noise voltage magnitude at a selected frequency for said amplifier circuit flicker noise, wherein said plurality of first coordinates is computed by receiving, for at least a measurement time interval, another output voltage of one of a plurality of amplifier circuits as another time domain voltage signal with another magnitude distribution, another thermal noise voltage having a magnitude, and another flicker noise voltage having a profile, digitizing at least a portion of said another time domain voltage signal corresponding to said measurement time interval to provide another corresponding plurality of time domain signal data, processing said another plurality of time domain signal data in accordance with a first Fast Fourier Transform (FFT) operation to compute at least a portion of said another flicker noise voltage profile below a corner frequency, wherein said another flicker noise voltage profile comprises a voltage versus frequency profile with each one of a plurality of successively decreasing noise voltage magnitudes at a respective one of a plurality of successively increasing frequencies, and a last one of said plurality of successively decreasing noise voltage magnitudes is at said corner frequency and approximately equal to said another thermal noise voltage magnitude, processing a portion of said plurality of time domain signal data corresponding to a portion of said measurement time interval in accordance with a second FFT operation to produce one of a plurality of first coordinates, and repeating said receiving digitizing and processings for each one of said plurality of amplifier circuits to produce said plurality of first coordinates and a plurality of second coordinates, wherein each one of said plurality of first coordinates comprises a first one of said plurality of successively decreasing noise voltage magnitudes at a selected one of said plurality of successively increasing frequencies, and each one of said plurality of second coordinates comprises a second one of said plurality of successively decreasing noise voltage magnitudes at said selected one of said plurality of successively increasing frequencies.

* * * * *

UNITED STATES PATENT AND TRADEMARK OFFICE
CERTIFICATE OF CORRECTION

| | | |
|---|---|---|
| PATENT NO. | : 7,096,133 B1 | Page 1 of 1 |
| APPLICATION NO. | : 10/908564 | |
| DATED | : August 22, 2006 | |
| INVENTOR(S) | : Samuel S. Martin et al. | |

It is certified that error appears in the above-identified patent and that said Letters Patent is hereby corrected as shown below:

Column 3, line 52 through to Column 6, line 44, please move this section to immediately follow Column 7, line 26.

Column 3, line 66, delete "(FFM)" and insert --(FFT)--.

Column 4, line 47, delete "then" and insert --thermal--.

Column 6, line 38, delete "fir" and insert --first--.

Column 11:
Line 7, delete "$S(f) = (1/T)^{2+} \left| {}_0\int^T (V(t)e^{j2\pi ft} dt) \right|^2$" and insert -- $S(f) = (1/T^2) * \left| {}_0\int^T (V(t)e^{j2\pi ft} dt) \right|^2$ --.

Line 9, delete "Hertz" and insert --Hertz--.

Line 22, delete "$ * {}_0\int^T (V(t)V(t+\Sigma)dt)$" and insert -- $* {}_0\int^T (V(t)V(t+\tau)dt)$ --.

Column 12, line 42, delete "tine" and insert --time--.

Column 15, line 65, delete "Hertz" and insert --Hertz--.

Column 16, line 18, delete "fis" and insert --first--.

Signed and Sealed this

Sixth Day of November, 2007

JON W. DUDAS
*Director of the United States Patent and Trademark Office*